United States Patent
Lim

(10) Patent No.: US 7,745,304 B2
(45) Date of Patent: Jun. 29, 2010

(54) METHOD OF MANUFACTURING SEMICONDUCTOR DEVICE

(75) Inventor: Hyun-Ju Lim, Mapo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 102 days.

(21) Appl. No.: 12/140,817

(22) Filed: Jun. 17, 2008

(65) Prior Publication Data
US 2008/0315352 A1      Dec. 25, 2008

(30) Foreign Application Priority Data
Jun. 22, 2007    (KR) .................. 10-2007-0061467

(51) Int. Cl.
H01L 21/762 (2006.01)

(52) U.S. Cl. ................ 438/424; 257/E21.55; 438/435; 438/437

(58) Field of Classification Search ................ 438/424, 438/435, 437; 257/510, E21.54, E21.546, 257/E21.549, E21.55
See application file for complete search history.

(56) References Cited

U.S. PATENT DOCUMENTS

| | | | | |
|---|---|---|---|---|
| 5,719,085 A * | 2/1998 | Moon et al. | .................. | 438/424 |
| 5,914,195 A * | 6/1999 | Hori et al. | .................. | 428/520 |
| 5,970,363 A * | 10/1999 | Kepler et al. | ................. | 438/435 |
| 6,040,232 A * | 3/2000 | Gau | .................. | 438/424 |
| 6,051,478 A * | 4/2000 | Ibok | .................. | 438/424 |
| 6,054,343 A * | 4/2000 | Ashburn | .................. | 438/221 |
| 6,074,927 A * | 6/2000 | Kepler et al. | ................. | 438/400 |
| 6,074,931 A * | 6/2000 | Chang et al. | ................. | 438/424 |
| 6,110,793 A * | 8/2000 | Lee et al. | .................. | 438/400 |
| 6,150,234 A * | 11/2000 | Olsen | .................. | 438/424 |
| 6,255,176 B1 * | 7/2001 | Kim et al. | .................. | 438/296 |
| 6,261,921 B1 * | 7/2001 | Yen et al. | .................. | 438/424 |
| 6,326,283 B1 * | 12/2001 | Liang et al. | .................. | 438/424 |
| 6,391,729 B1 * | 5/2002 | Hui | .................. | 438/296 |
| 6,417,070 B1 * | 7/2002 | Ballantine et al. | ........... | 438/424 |
| 6,426,271 B2 * | 7/2002 | Chen et al. | .................. | 438/435 |
| 6,566,224 B1 * | 5/2003 | Chang et al. | ................ | 438/424 |
| 6,589,854 B2 * | 7/2003 | Liu et al. | .................. | 438/435 |
| 6,689,665 B1 * | 2/2004 | Jang et al. | .................. | 438/296 |
| 6,825,128 B2 * | 11/2004 | Masuda | .................. | 438/750 |
| 6,878,588 B2 * | 4/2005 | Dong et al. | ................. | 438/257 |
| 6,974,755 B2 * | 12/2005 | Ko et al. | .................. | 438/424 |

(Continued)

*Primary Examiner*—Mary Wilczewski
(74) *Attorney, Agent, or Firm*—Sherr & Vaughn, PLLC

(57) ABSTRACT

A method of manufacturing a semiconductor device begins when a first dielectric pattern is formed on and/or over a substrate, and a first etching process is performed to form a trench in the substrate. An edge portion of the first trench is exposed. An oxidation process is performed on and/or over the substrate rounding the edge portion of the trench. A second dielectric is formed on and/or over the substrate including the trench, and a planarization process is performed on the second dielectric. A photoresist pattern is formed on and/or over the second dielectric corresponding to the trench, and a second etching process is performed to form a second dielectric pattern filling the trench. The photoresist pattern is removed. A second cleaning process is performed on the substrate including the trench to form a device isolation layer, which is formed by removing a portion of the second dielectric pattern. A portion of the second dielectric remains on the first dielectric pattern after the performing of the planarization process on the second dielectric.

9 Claims, 4 Drawing Sheets

U.S. PATENT DOCUMENTS

Figure 1:
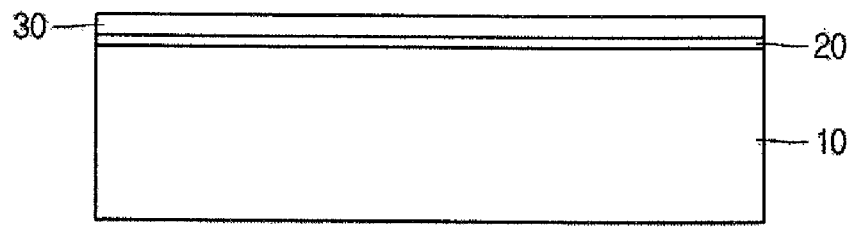

| | | | |
|---|---|---|---|
| 7,041,573 B2 * | 5/2006 | Jung | 438/424 |
| 7,091,105 B2 * | 8/2006 | Lee | 438/424 |
| 7,112,510 B2 * | 9/2006 | Lee | 438/424 |
| 7,402,500 B2 * | 7/2008 | Lee | 438/435 |
| 7,439,141 B2 * | 10/2008 | Kim et al. | 438/296 |
| 2001/0012676 A1 * | 8/2001 | Dickerson et al. | 438/435 |
| 2002/0001916 A1 * | 1/2002 | Chen et al. | 438/424 |
| 2002/0187616 A1 * | 12/2002 | Lai et al. | 438/425 |
| 2004/0157405 A1 * | 8/2004 | Lee | 438/435 |
| 2005/0003629 A1 * | 1/2005 | Yonekawa et al. | 438/424 |
| 2005/0161729 A1 * | 7/2005 | Dong et al. | 257/315 |
| 2006/0234469 A1 * | 10/2006 | Dickerson et al. | 438/424 |
| 2006/0276001 A1 * | 12/2006 | Ogawa | 438/424 |
| 2007/0042564 A1 * | 2/2007 | Yoon | 438/424 |
| 2007/0148908 A1 * | 6/2007 | Byun | 438/435 |

* cited by examiner

METHOD OF MANUFACTURING SEMICONDUCTOR DEVICE

The present application claims priority under 35 U.S.C. 119 to Korean Patent Application No. 10-2007-0061467 (filed on Jun. 22, 2007), which is hereby incorporated by reference in its entirety.

BACKGROUND

Embodiments relate to a method of manufacturing a semiconductor device. As semiconductor devices become more highly integrated, the cell size in memory devices becomes smaller. Accordingly, the size of device isolation regions within memory cells must be minimized. However, the size of a device isolation region is dependent on a device isolation region formation process and an alignment between structures in a memory array. Therefore, the reduction of the size of the device isolation region is somewhat limited.

Device isolation regions may be formed using a shallow trench isolation (STI) process instead of a local oxidation of silicon (LOCOS) process. The switch may be motivated by a "bird's beak" phenomenon in the LOCOS process, while the STI process has excellent device isolation characteristics. In addition, a device isolation region with a narrow width can be obtained using the STI process.

The STI process includes forming a trench in a semiconductor substrate, filling the trench with an oxide layer, and performing a chemical mechanical polishing (CMP) process. However, when the device isolation layer is formed using the STI process, an electric field may be concentrated on an edge of the trench of the device isolation layer to form an undesirable transistor. This degrades device characteristics.

SUMMARY

Embodiments provide a method of manufacturing a semiconductor device in which an edge portion of a trench can be rounded to prevent dislocation, thereby improving a dielectric characteristic between devices.

In embodiments, in a method of manufacturing a semiconductor device, a first dielectric pattern may be formed on and/or over a semiconductor substrate, and a first etching process may be performed to form at least one trench in the semiconductor substrate. An edge portion of the trench may be exposed to perform an oxidation process on the semiconductor substrate which rounds the edge portion of the trench. The trench may include a thermal oxide layer formed during the oxidation process. A second dielectric may be formed on and/or over the semiconductor substrate to fill the trench. A planarization process may be performed on the second dielectric formed on and/or over the semiconductor substrate. A photoresist pattern may be formed on and/or over the second dielectric corresponding to the trench. A second etching process may be performed to form a second dielectric pattern filling the trench. The photoresist pattern formed on and/or over the second dielectric pattern may then be removed. A second cleaning process may be performed on the semiconductor substrate including the trench filled with the second dielectric pattern to form a device isolation layer, which is formed by removing a portion of the second dielectric pattern filling the trench. A portion of the second dielectric may remain on the first dielectric pattern after the performing of the planarization process on the second dielectric.

The first dielectric pattern may include a pad oxide layer pattern and a nitride layer pattern. The nitride layer pattern may be removed before the forming of the second dielectric on and/or over the semiconductor substrate. The edge portion of the first trench may be exposed by performing a cleaning process to remove an edge portion of the pad oxide layer pattern. The remaining pad oxide layer pattern may be removed by performing a third cleaning process on the semiconductor substrate after the performing of the second cleaning process on the semiconductor substrate.

DRAWINGS

Example FIGS. 1 to 11 are cross-sectional views illustrating a process of manufacturing a semiconductor device according to embodiments.

DESCRIPTION

A method of fabricating the semiconductor device according to an embodiment will now be described with reference to the accompanying drawings. FIGS. 1 to 11 are cross-sectional views illustrating a process of manufacturing a semiconductor device according to embodiments.

Referring to example FIG. 1, a pad oxide layer 20 and a nitride layer 30 are formed on and/or over a semiconductor substrate 10. The pad oxide layer 20 may have a thickness of about 45 Å. The nitride layer 30 may include a silicon nitride (SiN) layer having a thickness ranging from about 100 Å to 200 Å.

Figure 2:
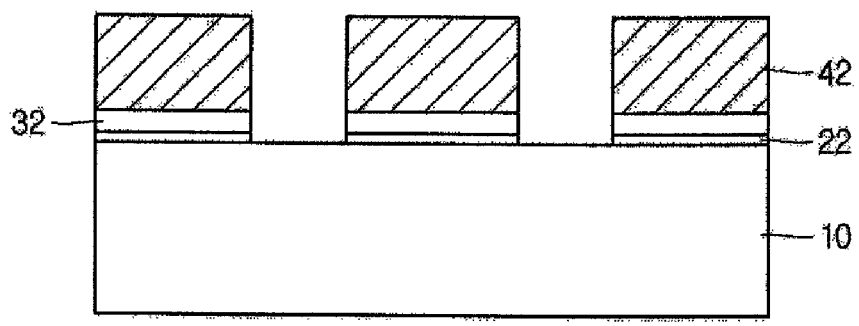

Referring to example FIG. 2, a first photoresist pattern 42 may be formed on and/or over the semiconductor substrate 10 including the pad oxide layer 20 and the nitride layer 30. An etching process may be performed on the resulting structure to form a first pad oxide layer pattern 22 and a nitride layer pattern 32.

Figure 3:
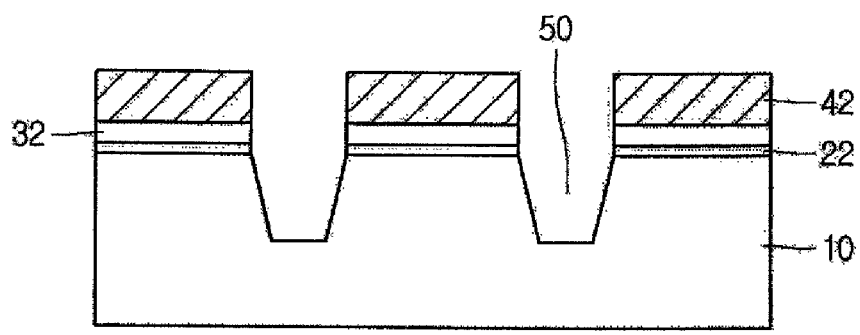

Referring to example FIG. 3, an etching process may be performed on the semiconductor substrate 10 to form a first trench 50. The first photoresist pattern 42 may be removed, and a first cleaning process for removing impurities generated during the first trench formation process may be performed. The first cleaning process may use, for example, a buffered hydrogen fluoride (BHF) solution or a dilute hydrogen fluoride (DHF) solution as a cleaning solution.

Figure 4:
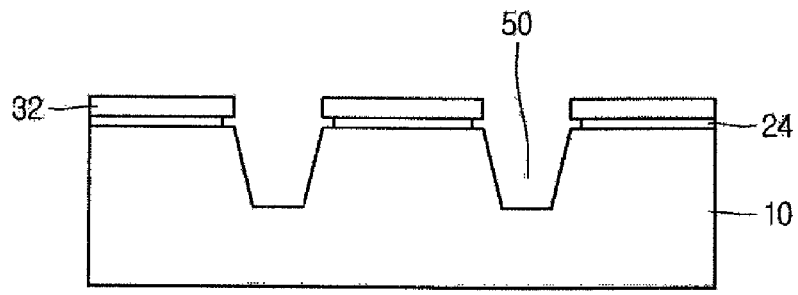

Referring to example FIG. 4, by performing the first cleaning process using the cleaning solution, a portion of the first pad oxide layer pattern 22 in contact with the cleaning solution is removed. An edge region of the first pad oxide layer pattern 22 is removed by performing the cleaning process to form a second pad oxide layer pattern 24 exposing an upper edge portion of the first trench 50.

Figure 5:
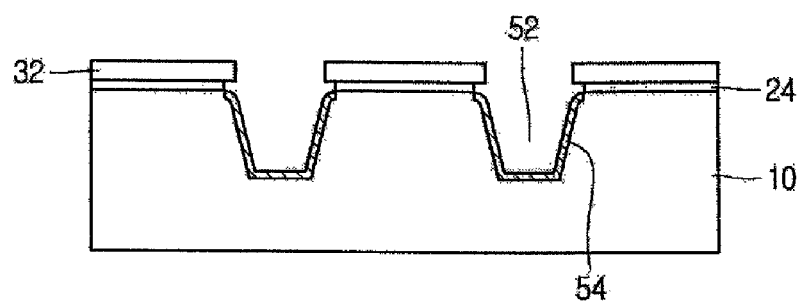

Referring to example FIG. 5, an oxidation process is performed on the semiconductor substrate 10 to form a modified trench 52 rounding the upper edge portion of the first trench 50. The oxidation process, for example, may be performed for a time ranging from about 50 minutes to 60 minutes at a temperature ranging from about 900° C. to about 1100° C. using a furnace.

Due to the oxidation process, a thermal oxide layer 54 is formed in the exposed portion of the first trench 50 to round the edge portion of the first trench 50 at which an energy concentration phenomenon occurs.

As the modified trench 52 is rounded due to the oxidation process, the occurrence of a hump phenomenon can be prevented to improve dielectric characteristic between devices. The hump phenomenon has an effect on transistor characteristics because an electric field is concentrated at the edge portion of the trench 50.

Figure 6:
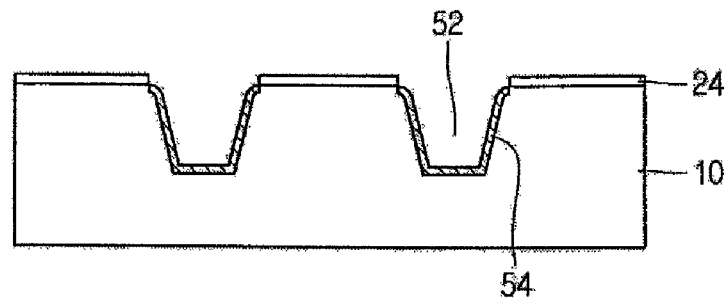

Referring to example FIG. 6, a wet etching process may be performed to remove the nitride layer pattern 32.

Figure 7:
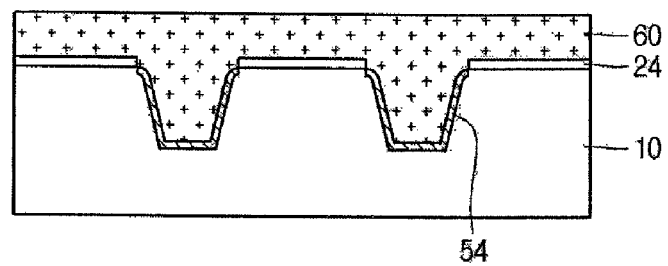

Referring to example FIG. 7, a dielectric 60 may be formed on and/or over the semiconductor substrate 10 such that the modified trench 52 is completely filled. A chemical mechanical polishing (CMP) process is performed to form the dielectric 60 after a dielectric layer is formed on and/or over the semiconductor substrate 10. The dielectric 60 also covers the second pad oxide layer pattern 24. The dielectric 60 may include, for example, a tetra ethyl ortho silicate (TEOS) oxide layer, an undoped silicate glass (USG) oxide layer, and a high density plasma (HDP) oxide layer.

Figure 8:
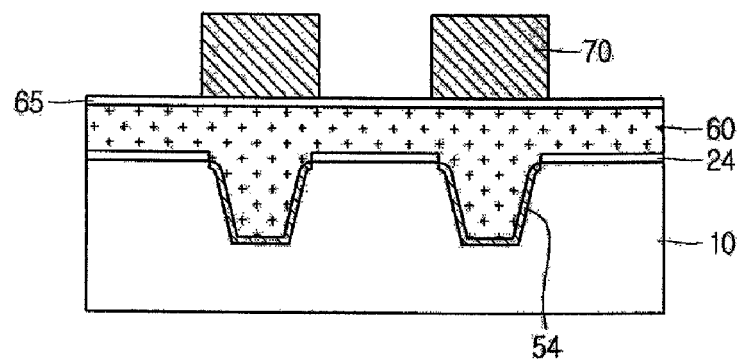

Referring to example FIG. 8, an anti-reflective layer 65 and a second photoresist pattern 70 are formed on and/or over the dielectric 60. The second photoresist pattern 70 may be formed on and/or over the dielectric 60 corresponding to the modified trench 52.

Figure 9:
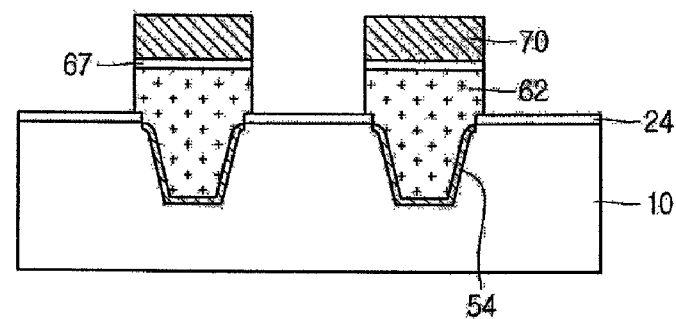

Referring to example FIG. 9, the anti-reflective layer 65 and the dielectric 60 are etched to form an anti-reflective layer pattern 67 and the dielectric pattern 62. The etching process may be performed, for example, using a reactive ion etching (RIE) process.

Figure 10:
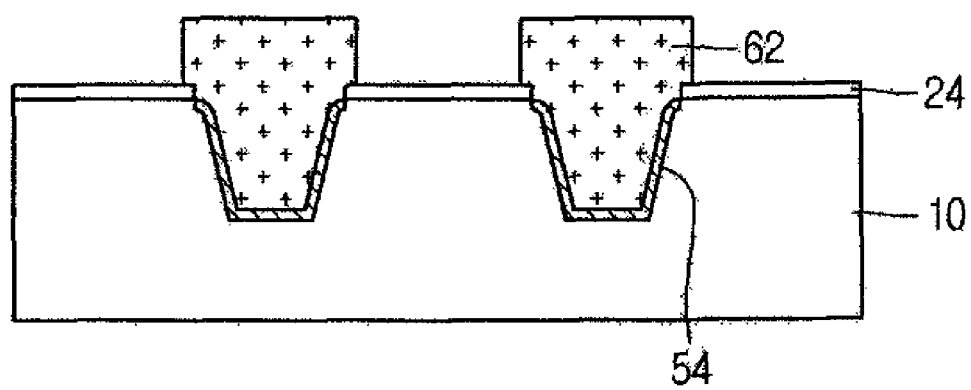

Referring to example FIG. 10, the second photoresist pattern 70 and the anti-reflective layer pattern 67 may be removed, and a second cleaning process for removing impurities generated during the etching process may be performed. The second cleaning process may use the BHF solution or the DHF solution as the cleaning solution.

Figure 11:
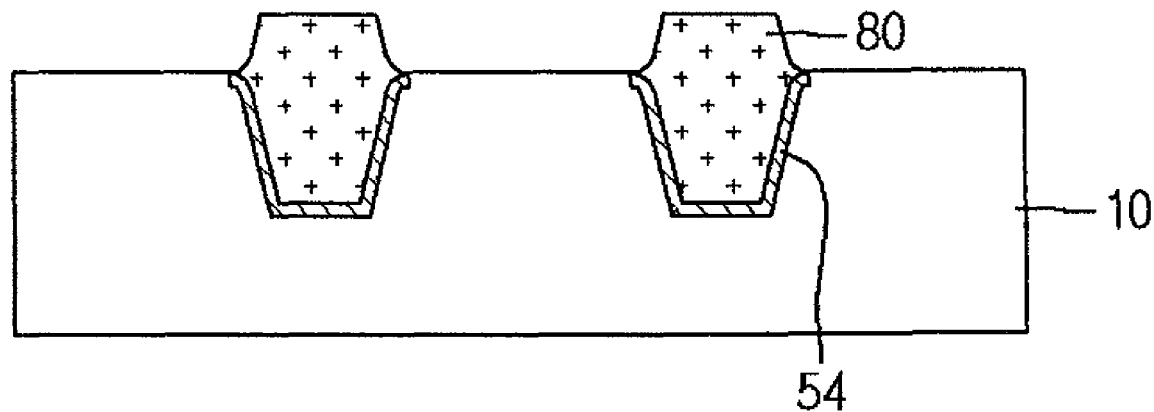

Referring to example FIG. 11, by performing the second cleaning process using the cleaning solution, a portion of the dielectric pattern 62 is removed to form a device isolation layer 80. Also, the second pad oxide layer pattern 24 is removed using the second cleaning process. When the second pad oxide layer pattern 24 remains, a subsequent cleaning process is performed to completely remove the second pad oxide layer pattern 24.

The process results in a shallow trench isolation structure wherein the upper edge of the thermal oxide layer and trench is rounded to effectively prevent a concentration of the electric field at the upper edge of the trench. Referring to example FIG. 11, the structure includes a semiconductor substrate 10, a trench formed in the semiconductor substrate, a thermal oxide layer 54 lining the trench, and a dielectric layer 62 filling the trench.

As described above, since the edge portion of the trench is rounded, the hump phenomenon can be prevented to improve the dielectric characteristic between the devices. It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a first dielectric pattern over a semiconductor substrate, and performing a first etching process to form at least one trench in the semiconductor substrate;
   exposing an edge portion of the trench;
   performing an oxidation process over the semiconductor substrate to round the edge portion of the trench;
   forming a second dielectric over the semiconductor substrate thereby filling the trench;
   performing a planarization process on the second dielectric formed over the semiconductor substrate;
   forming a photoresist pattern over the second dielectric corresponding to the trench;
   performing a second etching process to form a second dielectric pattern filling the trench;
   removing the photoresist pattern formed over the second dielectric pattern; and
   performing a second cleaning process on the semiconductor substrate comprising the trench filled with the second dielectric pattern to form a device isolation layer, which is formed by removing a portion of the second dielectric pattern filling the trench,
   wherein a portion of the second dielectric remains on the first dielectric pattern after the performing of the planarization process on the second dielectric.

2. The method of claim 1, wherein the first dielectric pattern comprises a pad oxide layer pattern and a nitride layer pattern.

3. The method of claim 2, further comprising removing the nitride layer pattern before the forming of the second dielectric over the semiconductor substrate.

4. The method of claim 2, wherein the edge portion of the first trench is exposed by performing a first cleaning process to remove an edge portion of the pad oxide layer pattern.

5. The method of claim 3, wherein the remaining pad oxide layer pattern is removed by performing a third cleaning process on the semiconductor substrate after the performing of the second cleaning process on the semiconductor substrate.

6. The method of claim 4, wherein each of the cleaning processes uses one of a buffered hydrogen fluoride solution and a dilute hydrogen fluoride solution as a cleaning solution.

7. The method of claim 1, wherein the oxidation process is performed in a furnace.

8. The method of claim 1, wherein the oxidation process is performed for a time ranging from about 50 minutes to 60 minutes at a temperature ranging from about 900° C. to about 1100° C.

9. The method of claim 1, wherein the trench comprises a thermal oxide layer formed during the oxidation process.

* * * * *